US012696397B2

(12) United States Patent　　　　　(10) Patent No.:　US 12,696,397 B2
Tsukada　　　　　　　　　　　　　　　(45) Date of Patent:　　　Jul. 28, 2026

(54) CIRCUIT-FORMING METHOD AND CIRCUIT-FORMING APPARATUS

(71) Applicant: FUJI CORPORATION, Chiryu (JP)

(72) Inventor: Kenji Tsukada, Toyota (JP)

(73) Assignee: FUJI CORPORATION, Chiryu (JP)

(*) Notice: Subject to any disclaimer, the term of this patent is extended or adjusted under 35 U.S.C. 154(b) by 102 days.

(21) Appl. No.: 18/701,844

(22) PCT Filed: Nov. 4, 2021

(86) PCT No.: PCT/JP2021/040520
　　　§ 371 (c)(1),
　　　(2) Date: Apr. 16, 2024

(87) PCT Pub. No.: WO2023/079607
　　　PCT Pub. Date: May 11, 2023

(65) Prior Publication Data
　　　US 2024/0422916 A1　　Dec. 19, 2024

(51) Int. Cl.
　　　*H05K 3/00*　　　(2006.01)
　　　*H05K 3/12*　　　(2006.01)
　　　*H05K 3/303*　　　(2026.01)
(52) U.S. Cl.
　　　CPC ........... *H05K 3/125* (2013.01); *H05K 3/0088* (2013.01); *H05K 3/1258* (2013.01); *H05K 3/303* (2013.01); *H05K 2203/013* (2013.01); *H05K 2203/0763* (2013.01); *H05K 2203/1438* (2013.01)
(58) Field of Classification Search
　　　CPC ...................................................... H05K 3/00
　　　See application file for complete search history.

(56) References Cited

U.S. PATENT DOCUMENTS

| | | |
|---|---|---|
| 2004/0036731 A1 | 2/2004 | Ready et al. |
| 2015/0104562 A1 | 4/2015 | Subbaraman et al. |
| 2017/0203508 A1 | 7/2017 | Dikovsky et al. |

(Continued)

FOREIGN PATENT DOCUMENTS

| | | |
|---|---|---|
| EP | 1 879 437 A1 | 1/2008 |
| JP | 2017-516295 A | 6/2017 |

(Continued)

OTHER PUBLICATIONS

International Search Report Issued Jan. 25, 2022, in PCT/JP2021/040520, filed on Nov. 4, 2021, 2 pages.

*Primary Examiner* — Gordon Baldwin
*Assistant Examiner* — Mohammad Mayy
(74) *Attorney, Agent, or Firm* — Oblon, McClelland, Maier & Neustadt, L.L.P.

(57)　　　　　　ABSTRACT

A circuit-forming method includes a first forming step of forming a resin layer including a recessed portion by a first discharge device configured to discharge a curable resin, and a second forming step of forming an electrode inside the recessed portion by a second discharge device, which is configured to discharge a conductive paste, by referring to a first mark formed by the first discharge device. A circuit-forming apparatus includes a first discharge device configured to form a resin layer including a recessed portion by discharging a curable resin, and a second discharge device configured to form an electrode inside the recessed portion by discharging a conductive paste by referring to a first mark formed by the first discharge device.

5 Claims, 15 Drawing Sheets

(56)  References Cited

U.S. PATENT DOCUMENTS

2017/0280567 A1* 9/2017 Suzuki ............... B29C 67/0003
2022/0039263 A1* 2/2022 Tsukada ................... H05K 3/28

FOREIGN PATENT DOCUMENTS

WO      WO 2020/012626 A1      1/2020
WO      WO-2020079744 A1 *   4/2020   .......... H05K 3/4007
WO      WO 2020/250381 A1    12/2020

* cited by examiner

CIRCUIT-FORMING METHOD AND CIRCUIT-FORMING APPARATUS

TECHNICAL FIELD

The present disclosure relates to a circuit-forming method or the like in which a resin layer including a recessed portion is formed of a curable resin, and an electrode is formed inside the recessed portion by a conductive paste.

BACKGROUND ART

The following patent literature describes a technique in which a resin layer including a recessed portion is formed of a curable resin, and an electrode is formed inside the recessed portion.

PATENT LITERATURE

Patent Literature 1: WO2020/250381

BRIEF SUMMARY

Technical Problem

An object of the present description is to appropriately form an electrode inside a recessed portion of a resin layer by a conductive paste.

Solution to Problem

In order to solve the above problem, the present description discloses a circuit-forming method including a first forming step of forming a resin layer including a recessed portion by a first discharge device configured to discharge a curable resin, and a second forming step of forming an electrode inside the recessed portion by a second discharge device, which is configured to discharge a conductive paste, by referring to a first mark formed by the first discharge device.

In addition, the present description discloses a circuit-forming apparatus including a first discharge device that forms a resin layer including a recessed portion by discharging a curable resin, and a second discharge device that forms an electrode inside the recessed portion by discharging a conductive paste by referring to a first mark formed by the first discharge device.

Advantageous Effects

According to the present disclosure, a resin layer including a recessed portion is formed by a first discharge device configured to discharge a curable resin, and an electrode is formed inside the recessed portion by a second discharge device, which is configured to discharge a conductive paste, by referring to a first mark formed by the first discharge device. As a result, the electrode can be appropriately formed by the conductive paste inside the recessed portion of the resin layer.

DESCRIPTION OF EMBODIMENTS

Figure 1:
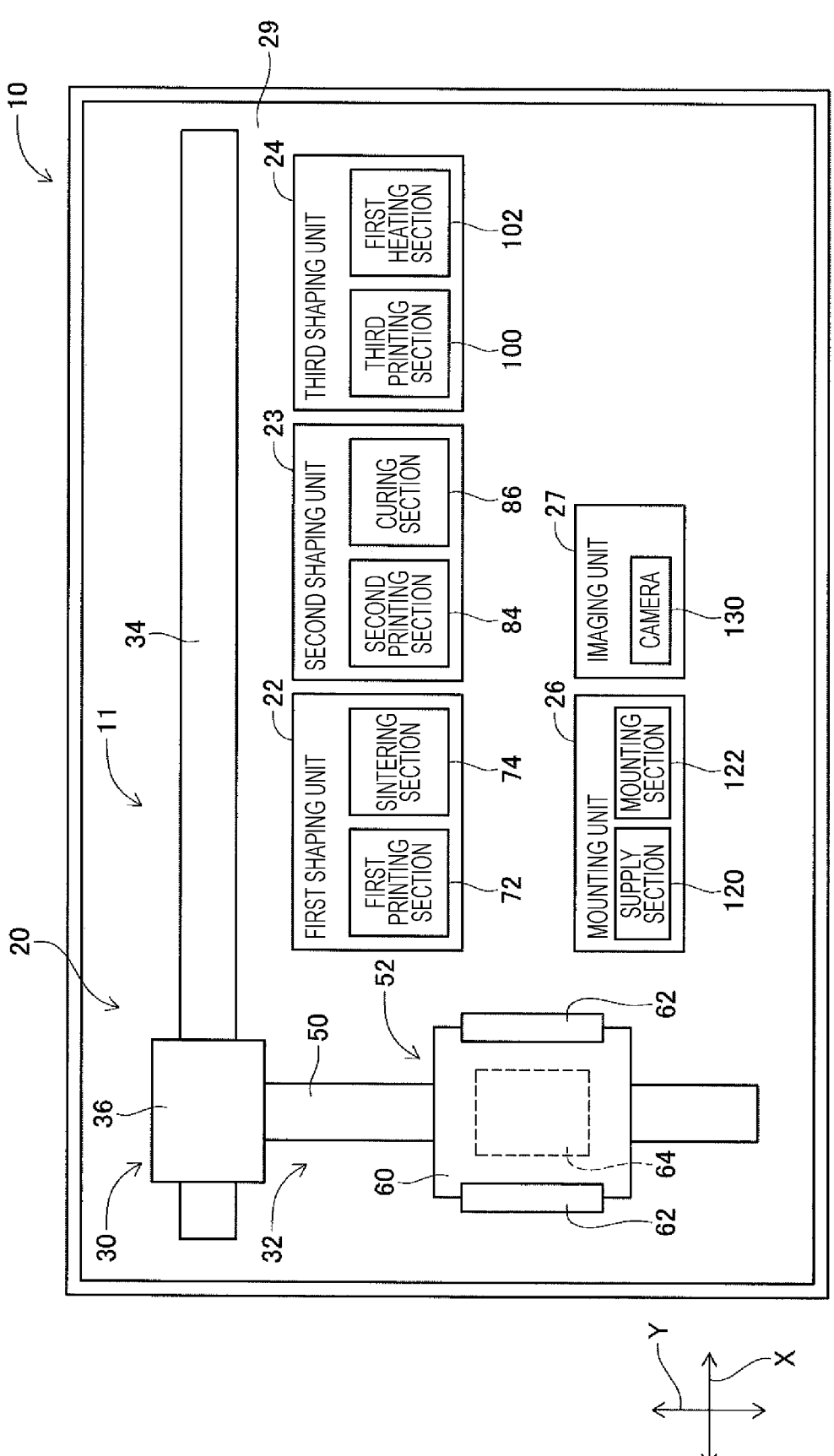
FIG. 1 is a diagram illustrating a circuit-forming apparatus.

FIG. 1 illustrates circuit-forming apparatus 10 of a first embodiment. Circuit-forming apparatus 10 includes conveyance device 20, first shaping unit 22, second shaping unit 23, third shaping unit 24, mounting unit 26, imaging unit 27, and control device 28 (refer to FIG. 2). Conveyance device 20, first shaping unit 22, second shaping unit 23, third shaping unit 24, mounting unit 26, and imaging unit 27 are disposed on base 29 of circuit-forming apparatus 10. Base 29 has a generally rectangular shape, and in the following description, a longer direction of base 29 will be referred to as an X-axis direction, a shorter direction of base 29 will be referred to as a Y-axis direction, and a direction orthogonal to both the X-axis direction and the Y-axis direction will be referred to as a Z-axis direction.

Conveyance device 20 is provided with X-axis slide mechanism 30 and Y-axis slide mechanism 32. X-axis slide mechanism 30 includes X-axis slide rail 34 and X-axis slider 36. X-axis slide rail 34 is disposed on base 29 to extend in the X-axis direction. X-axis slider 36 is held by X-axis slide rail 34 to be slidable in the X-axis direction. X-axis slide mechanism 30 further includes electromagnetic motor 38 (refer to FIG. 2), and X-axis slider 36 is moved to any position in the X-axis direction by driving electromagnetic motor 38. In addition, Y-axis slide mechanism 32 includes Y-axis slide rail 50 and stage 52. Y-axis slide rail 50 is disposed on base 29 to extend in the Y-axis direction and is movable in the X-axis direction. Then, one end portion of Y-axis slide rail 50 is coupled to X-axis slider 36. Stage 52 is held on Y-axis slide rail 50 to be slidable in the Y-axis direction. Furthermore. Y-axis slide mechanism 32 includes electromagnetic motor 56 (refer to FIG. 2), and stage 52 is moved to any position in the Y-axis direction by driving electromagnetic motor 56. As a result, stage 52 is moved to any position on base 29 with the driving of X-axis slide mechanism 30 and Y-axis slide mechanism 32.

Stage 52 includes base plate 60, holding devices 62, and lifting and lowering device 64. Base plate 60 is formed in a flat plate shape, and a board is placed on an upper surface of base plate 60. Holding devices 62 are provided on both side portions of base plate 60 in the X-axis direction. Then, both edge portions of pallet 70 (refer to FIG. 3) placed on base plate 60 in the X-axis direction are sandwiched by holding devices 62, so that pallet 70 is fixedly held. In addition, lifting and lowering device 64 is disposed below base plate 60, and lifts and lowers base plate 60.

First shaping unit 22 is a unit that shapes a wiring on pallet 70 placed on base plate 60 of stage 52, and includes first printing section 72 and sintering section 74. First printing section 72 includes inkjet head 76 (refer to FIG. 2), and inkjet head 76 linearly discharges metal ink. The metal ink is ink obtained by dispersing nanometer-sized metal fine particles, for example, silver fine particles in a solvent. A surface of the metal fine particles is coated with a dispersant and aggregation in the solvent is prevented. In addition, inkjet head 76 discharges the metal ink from multiple nozzles by, for example, a piezo method using a piezoelectric element.

Figure 2:
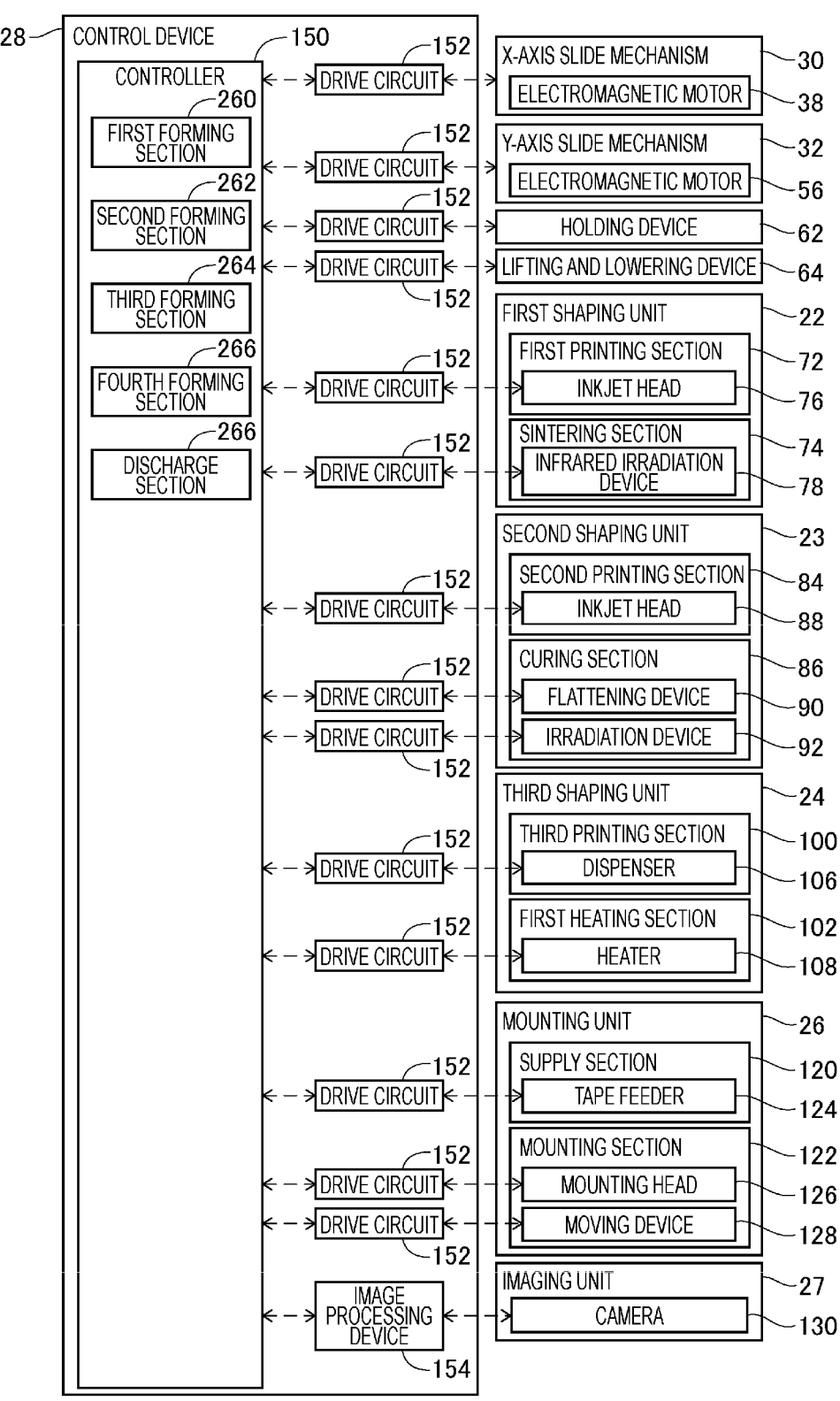
FIG. 2 is a block diagram illustrating a control device.

Sintering section 74 includes infrared irradiation device 78 (refer to FIG. 2). Infrared irradiation device 78 is a device for irradiating the discharged metal ink with infrared light, and the metal ink irradiated with infrared light is sintered to form the wiring. Sintering of the metal ink is, for example, a phenomenon in which evaporation of a solvent or decomposition of a protective film of metal fine particles, that is, a dispersant, or the like is performed by applying energy, so that conductivity is increased by contacting or fusing the metal fine particles. Then, the metal ink is sintered to form a metal wiring.

In addition, second shaping unit 23 is a unit that shapes a resin layer on pallet 70 placed on base plate 60 of stage 52, and includes second printing section 84 and curing section 86. Second printing section 84 includes inkjet head 88 (refer to FIG. 2), and inkjet head 88 discharges an ultraviolet curable resin. The ultraviolet curable resin is a resin that is cured by irradiation with ultraviolet light. Inkjet head 88 may be, for example, a piezo type using a piezoelectric element, or may be a thermal type in which a resin is heated to generate air bubbles, which are discharged from multiple nozzles.

Curing section 86 includes flattening device 90 (refer to FIG. 2) and irradiation device 92 (refer to FIG. 2). Flattening device 90 flattens an upper surface of the ultraviolet curable resin discharged by inkjet head 88, and makes the thickness of the ultraviolet curable resin uniform, for example, by scraping off excess resin by a roller or a blade while leveling the surface of the ultraviolet curable resin. In addition, irradiation device 92 includes a mercury lamp or LED as a light source, and irradiates the discharged ultraviolet curable resin with ultraviolet light. As a result, the discharged ultraviolet curable resin is cured to form the resin layer.

Third shaping unit 24 is a unit that shapes a connection portion between an electrode of an electronic component and the wiring on pallet 70 placed on base plate 60 of stage 52, and includes third printing section 100 and first heating section 102. Third printing section 100 includes dispenser 106 (refer to FIG. 2), and dispenser 106 discharges conductive resin paste. The conductive resin paste is paste in which micrometer-sized metal particles are dispersed in a resin cured by heating at a relatively low temperature. Incidentally, the metal particles are flake-shaped, and viscosity of the conductive resin paste is relatively higher than that of the metal ink. The discharge amount of the conductive resin paste by dispenser 106 is controlled by an inner diameter of a needle, the pressure during discharge, and the discharge time.

First heating section 102 includes heater 108 (refer to FIG. 2). Heater 108 is a device that heats the conductive resin paste applied by dispenser 106, and a resin is cured in the heated conductive resin paste. In this case, in the conductive resin paste, the resin is cured and contracted, and the dispersed flake-shaped metal particles contact the resin. As a result, the conductive resin paste exhibits conductivity. In addition, the resin of the conductive resin paste is an organic adhesive, and exhibits an adhesive force when cured by heating.

In addition, mounting unit 26 is a unit for mounting the electronic component on pallet 70 placed on base plate 60 of stage 52, and includes supply section 120 and mounting section 122. Supply section 120 includes multiple tape feeders 124 (refer to FIG. 2) that feed the taped electronic components one by one, and supplies the electronic component to the supply position. Supply section 120 is not limited to tape feeder 124, and may be a tray-type supply device that supplies the electronic component by picking up the electronic component from a tray. In addition, supply section 120 may include both of the tape-type supply device and the tray-type supply device, or other supply devices.

Mounting section 122 includes mounting head 126 (refer to FIG. 2) and moving device 128 (refer to FIG. 2). Mounting head 126 includes a suction nozzle (not illustrated) for picking up and holding the electronic component. The suction nozzle picks up and holds the electronic component by suction of air as a negative pressure is supplied from a positive and negative pressure supply device (not illustrated). Then, as a slight positive pressure is supplied from the positive and negative pressure supply device, the electronic component is separated. In addition, moving device 128 moves mounting head 126 between the supply position of the electronic component by tape feeder 124 and pallet 70 placed on base plate 60. As a result, in mounting section 122, the electronic component supplied from tape feeder 124 is held by the suction nozzle, and the electronic component held by the suction nozzle is mounted on pallet 70.

Imaging unit 27 is a unit for imaging pallet 70 placed on base plate 60 of stage 52, and includes camera 130. Camera 130 is disposed above base 29 in a posture facing downward, and images the upper surface of pallet 70 placed on base plate 60 of stage 52 from the above.

In addition, as illustrated in FIG. 2, control device 28 is provided with controller 150, multiple drive circuits 152, and image processing device 154. Multiple drive circuits 152 are connected to electromagnetic motors 38 and 56, holding device 62, lifting and lowering device 64, inkjet head 76, infrared irradiation device 78, inkjet head 88, flattening device 90, irradiation device 92, dispenser 106, heater 108, tape feeder 124, mounting head 126, and moving device 128. Controller 150 includes CPU. ROM. RAM, or the like, mainly includes a computer, and is connected to multiple drive circuits 152. As a result, controller 150 controls the operations of conveyance device 20, first shaping unit 22, second shaping unit 23, third shaping unit 24, and mounting unit 26. In addition, controller 150) is connected to image processing device 154. Image processing device 154 is for processing the imaging data obtained by camera 130, and controller 150 acquires various information from the imaging data.

With the configuration described above, in circuit-forming apparatus 10, a resin stack is formed on pallet 70, and a wiring is formed on the upper surface of the resin stack. Then, the electrodes of the electronic component are electrically connected to the wiring via the conductive resin paste.

Figure 3:
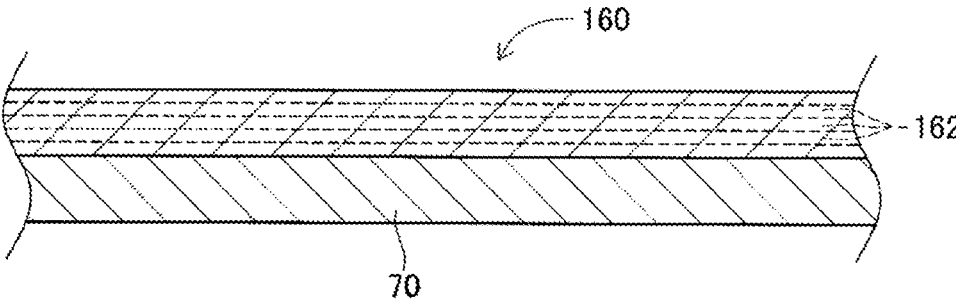
FIG. 3 is a cross-sectional view illustrating a circuit in a state where a resin stack is formed.

Specifically, pallet 70 is set on base plate 60 of stage 52, and stage 52 is moved below second shaping unit 23. Then, in second shaping unit 23, as illustrated in FIG. 3, resin stack 160 is formed on pallet 70. Resin stack 160 is formed by repeating the discharge of the ultraviolet curable resin from inkjet head 88 and the irradiation with ultraviolet light by irradiation device 92 to the discharged ultraviolet curable resin.

More specifically, in second printing section 84 of second shaping unit 23, inkjet head 88 discharges the ultraviolet curable resin in a thin film shape on the upper surface of pallet 70. Subsequently, when the ultraviolet curable resin is discharged in the thin film shape, the surface of the ultraviolet curable resin is flattened by flattening device 90 in curing section 86 such that the ultraviolet curable resin has a uniform film thickness. Then, irradiation device 92 irradiates the thin film-shaped ultraviolet curable resin with ultraviolet light. As a result, thin film-shaped resin layer 162 is formed on pallet 70.

Subsequently, inkjet head 88 discharges the ultraviolet curable resin in a thin film shape onto thin film-shaped resin layer 162. Then, the thin film-shaped ultraviolet curable resin is flattened by flattening device 90, irradiation device 92 irradiates the ultraviolet curable resin discharged in a thin film shape with ultraviolet light, and thus thin film-shaped resin layer 162 is stacked on thin film-shaped resin layer 162. As described above, the discharge of the ultraviolet curable resin onto thin film-shaped resin layer 162, the flattening of the surface of the ultraviolet curable resin, and the curing of the ultraviolet curable resin are repeated, and multiple resin layers 162 are stacked and thus resin stack 160) is formed.

Figure 4:
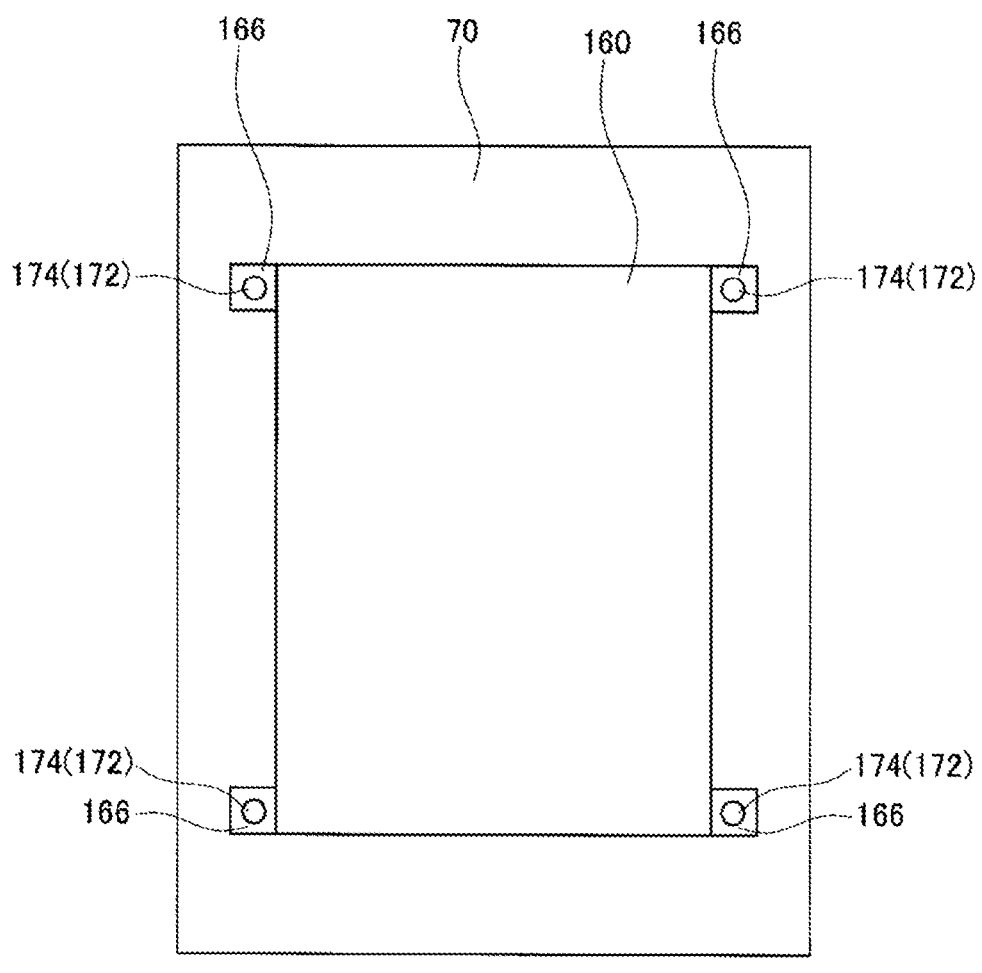
FIG. 4 is a diagram illustrating a metal mark.

As illustrated in FIG. 4, resin stack 160 is formed in a generally rectangular shape when viewed from above. Then, generally block-shaped first base 166 is formed on pallet 70 adjacent to the four corners of rectangular resin stack 160. First base 166 is formed in the same manner as resin stack 160. That is, after the ultraviolet curable resin is discharged in a thin film shape and the surface of the ultraviolet curable resin is flattened by flattening device 90, the ultraviolet curable resin is cured by the irradiation of the ultraviolet curable resin with the ultraviolet light. As a result, a resin layer is formed. Then, the discharge of the ultraviolet curable resin, the flattening of the surface of the ultraviolet curable resin, and the curing of the ultraviolet curable resin are repeated and the resin layers are stacked, and thus first base 166 is formed.

Figure 5:
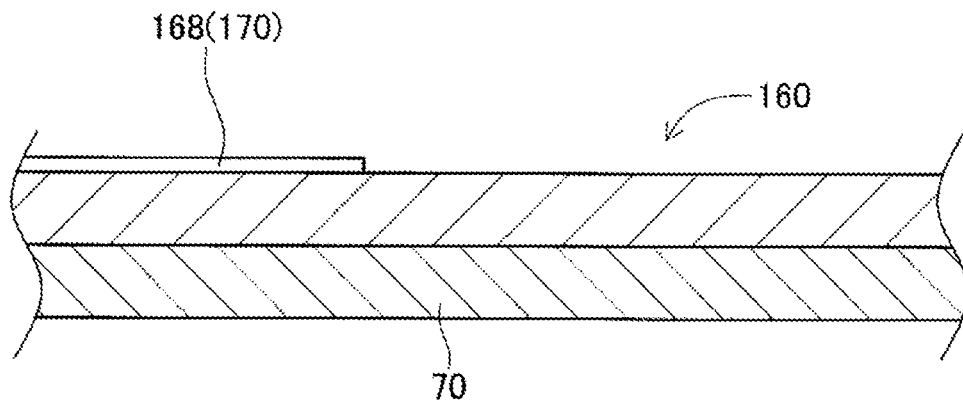
FIG. 5 is a cross-sectional view illustrating a circuit in a state where a wiring is formed on the resin stack.

When resin stack 160 and first base 166 are formed by the above-described procedure, stage 52 is moved below first shaping unit 22. Then, in first printing section 72 of first shaping unit 22, as illustrated in FIG. 5, inkjet head 76 linearly discharges metal ink 168 on the upper surface of resin stack 160 in accordance with the circuit pattern. Subsequently, infrared irradiation device 78 irradiates metal ink 168 discharged in accordance with the circuit pattern with infrared light in sintering section 74 of first shaping unit 22. As a result, metal ink 168 is sintered, and wiring 170 is formed on resin stack 160.

In addition, in first shaping unit 22, as illustrated in FIG. 4, metal mark 172 is formed on first base 166. That is, in first printing section 72 of first shaping unit 22, inkjet head 76 discharges metal ink 174 in a circular shape onto first base 166. Subsequently, infrared irradiation device 78 irradiates metal ink 174 discharged in a circular shape with infrared light in sintering section 74 of first shaping unit 22. As a result, metal ink 174 is sintered, and metal mark 172 is formed on first base 166.

Figure 6:
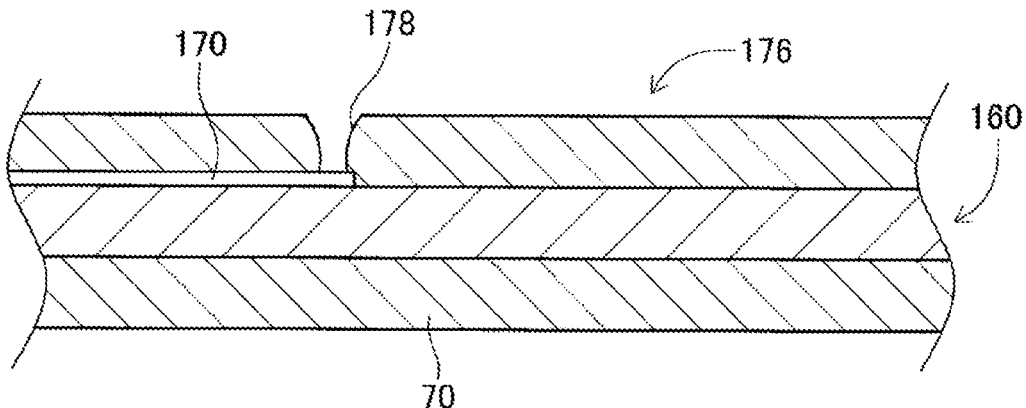
FIG. 6 is a cross-sectional view illustrating a circuit in a state where a resin stack is formed on a resin stack.

Then, when wiring 170 and metal mark 172 are formed, wiring 170 and metal mark 172 are moved below second shaping unit 23. Then, in second shaping unit 23, as illustrated in FIG. 6, resin stack 176 is formed on resin stack 160. Although resin stack 176 is formed by the same method as that of resin stack 160, resin stack 176 has hole 178, and the end portion of wiring 170 formed on resin stack 160 is exposed to hole 178. Therefore, when resin stack 176 is formed, the ultraviolet curable resin is discharged onto the upper surface of resin stack 160 such that the end portion of wiring 170 is exposed. After the surface of the ultraviolet curable resin is flattened by flattening device 90, the ultraviolet curable resin is cured by the irradiation of the ultraviolet curable resin with the ultraviolet light. As a result, a resin layer is formed. Then, the discharge of the ultraviolet curable resin to a portion other than the end portion of wiring 170, the flattening of the surface of the ultraviolet curable resin, and the curing of the ultraviolet curable resin are repeated, and thus resin stack 176 having hole 178 is formed.

As described above, when resin stack 176 having hole 178 is formed, stage 52 is moved below third shaping unit 24. Then, in third printing section 100 of third shaping unit 24, dispenser 106 discharges the conductive resin paste into hole 178 of resin stack 176. At this time, dispenser 106 refers to metal mark 172 and discharges the conductive resin paste onto the end portion of wiring 170.

More specifically, when metal mark 172 is formed on first shaping unit 22, stage 52 is moved below imaging unit 27. Then, in imaging unit 27, camera 130 images four metal marks 172 formed on first base 166. Then, the imaging data obtained through the imaging is analyzed in controller 150, and the positions of four metal marks 172 are calculated based on the imaging data. As a result, the formation position of wiring 170 formed by inkjet head 76 in similar manner as metal mark 172 can be appropriately recognized.

Figure 7:
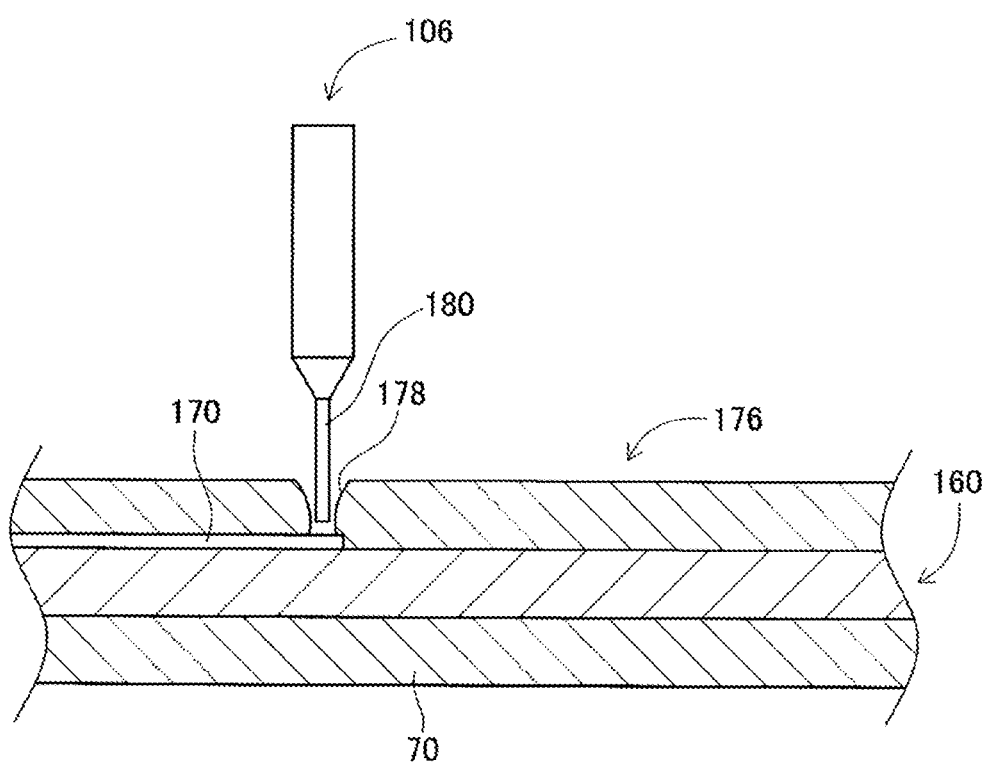
FIG. 7 is a cross-sectional view illustrating a circuit when conductive resin paste is discharged into a hole of the resin stack.
Figure 8:
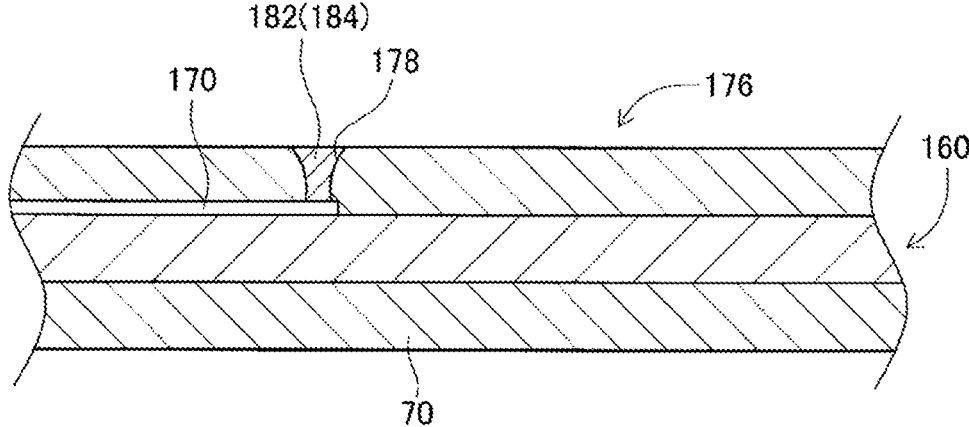
FIG. 8 is a cross-sectional view illustrating a circuit in a state where a connection electrode is formed inside the hole of the resin stack.

Stage 52 is moved below third shaping unit 24, and the operation of conveyance device 20 is controlled based on the position of metal mark 172 such that dispenser 106 is positioned above the end portion of wiring 170 in third printing section 100 of third shaping unit 24. As a result, dispenser 106 and the end portion of wiring 170 are appropriately matched. Then, stage 52 is raised by the operation of lifting and lowering device 64, so that, as illustrated in FIG. 7, the distal end of nozzle 180 of dispenser 106 enters the inside of hole 178 of resin stack 176. This is because the end portion of wiring 170 is exposed to hole 178. Then, when the distal end of nozzle 180 of dispenser 106 enters the inside of hole 178, dispenser 106 discharges the conductive resin paste. At this time, as illustrated in FIG. 8, dispenser 106 discharges conductive resin paste 182 in an amount that fills the inside of hole 178. In first heating section 102 of third shaping unit 24, conductive resin paste 182 is heated by heater 108. As a result, conductive resin paste 182 is made conductive and functions as an electrode, so that conductive resin paste 182 and wiring 170 are electrically connected. Conductive resin paste 182 is referred to as connection electrode 184.

Figure 9:
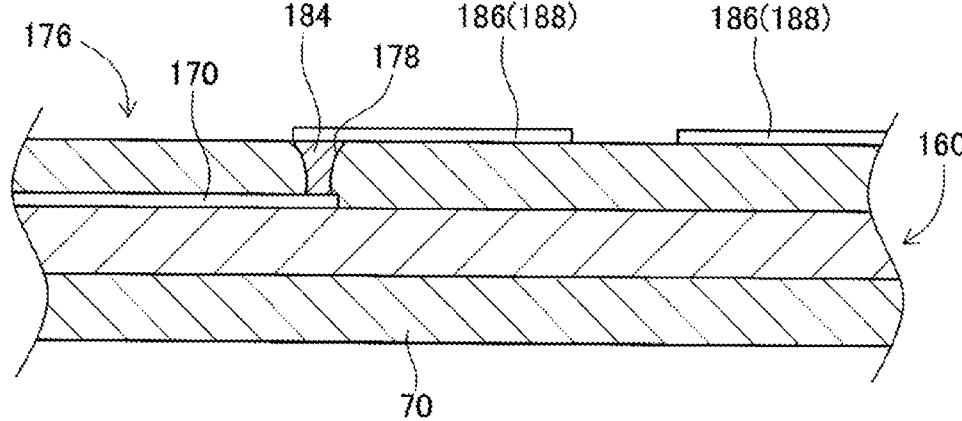
FIG. 9 is a cross-sectional view illustrating a circuit in a state where the wiring is formed on the resin stack.

As described above, when wiring 170 and connection electrode 184 are electrically connected, stage 52 is moved below first shaping unit 22. Then, in first printing section 72 of first shaping unit 22, as illustrated in FIG. 9, inkjet head 76 linearly discharges metal ink 186 on the upper surface of resin stack 176 in accordance with the circuit pattern. At this time, inkjet head 76 discharges metal ink 186 onto the upper surface of resin stack 176 such that one end of metal ink 186 is in contact with connection electrode 184. Then, infrared irradiation device 78 irradiates metal ink 186 with infrared light in sintering section 74 of first shaping unit 22. As a result, metal ink 186 is sintered, and wiring 188 electrically connected to wiring 170 via connection electrode 184 is formed on resin stack 176.

Figure 10:
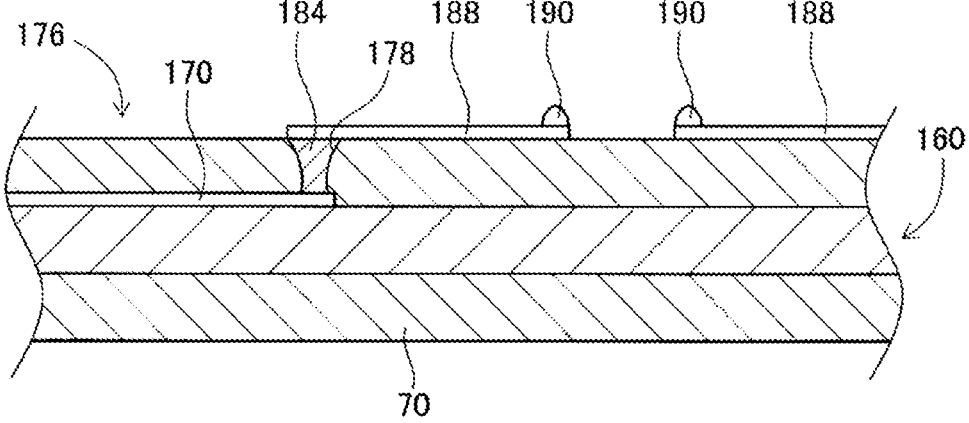
FIG. 10 is a cross-sectional view illustrating a circuit in a state where the conductive resin paste is applied on the wiring.

Subsequently, when wiring 188 is formed on resin stack 176, stage 52 is moved below third shaping unit 24. Then, in third printing section 100 of third shaping unit 24, dispenser 106 discharges conductive resin paste 190 onto the end portion of wiring 188, as illustrated in FIG. 10. At this time, dispenser 106 refers to metal mark 172 and discharges conductive resin paste 190 onto the end portion of wiring 188. That is, the operation of conveyance device 20 is controlled based on the position of metal mark 172 such that dispenser 106 is positioned above the end portion of wiring 188. As a result, dispenser 106 and the end portion of wiring 188 are appropriately matched. Then, after stage 52 is raised by the operation of lifting and lowering device 64, dispenser 106 discharges conductive resin paste 190 onto the end portion of wiring 188.

Figure 11:
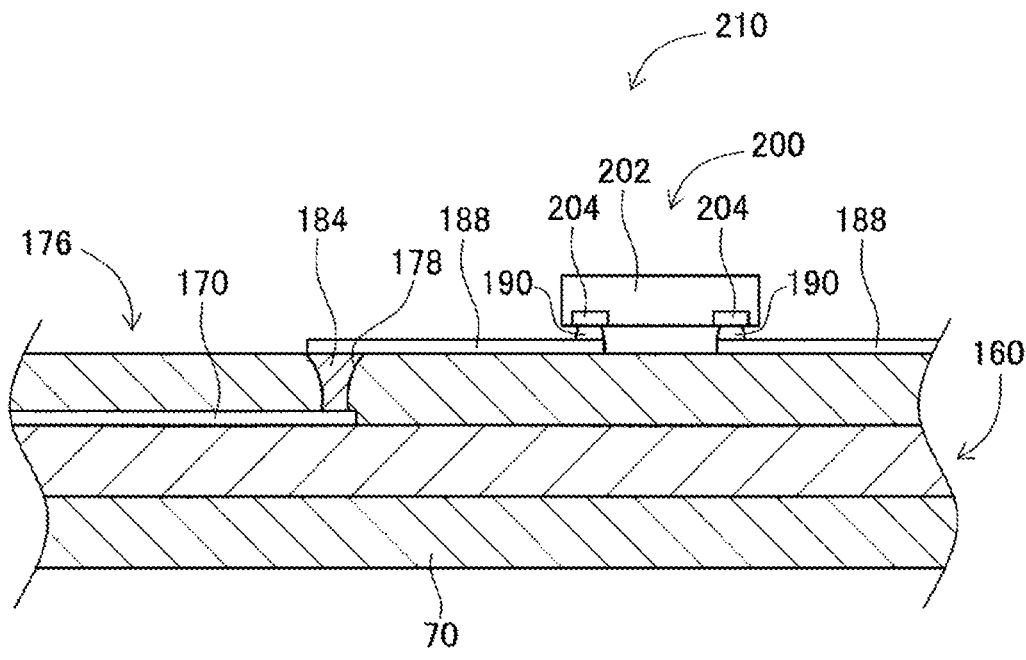
FIG. 11 is a cross-sectional view illustrating a circuit in a state where an electronic component is mounted.

As described above, when conductive resin paste 190 is discharged onto the end portion of wiring 188, stage 52 is moved below mounting unit 26. In mounting unit 26, electronic component 200 (refer to FIG. 11) is supplied by tape feeder 124, and electronic component 200 is held by the suction nozzle of mounting head 126. As illustrated in FIG. 11, electronic component 200 is configured with component body 202 and two electrodes 204 disposed on the lower surface of component body 202. Then, mounting head 126 is moved by moving device 128, and electronic component 200 held by suction nozzle is mounted on the upper surface of resin stack 176. In this case, electronic component 200 is mounted on the upper surface of resin stack 176 such that electrode 204 of electronic component 200 is in contact with conductive resin paste 190 discharged onto wiring 188.

As described above, when electronic component 200 is mounted on resin stack 176, stage 52 is moved below third shaping unit 24. Then, in first heating section 102 of third shaping unit 24, conductive resin paste 190 is heated by heater 108. As a result, conductive resin paste 190 exhibits conductivity, so that electrode 204 is electrically connected to wiring 188 via conductive resin paste 190. In addition, electronic component 200 is fixed to resin stack 176 by being fixed to wiring 188 due to the adhesive force of conductive resin paste 190.

As described above, in circuit-forming apparatus 10, wiring 170 formed on resin stack 160 and wiring 188 formed on resin stack 176 are electrically connected to each other via connection electrode 184 formed in hole 178 of resin stack 176. Then, electrode 204 of electronic component 200 is electrically connected to wiring 188 via conductive resin paste 190, so that circuit 210 is formed. In particular, conductive resin paste 182 discharged when connection electrode 184 connecting wiring 170 and wiring 188 is formed and conductive resin paste 190 connecting wiring 188 and electrode 204 of electronic component 200 are discharged by referring to metal mark 172. As a result, conductive resin pastes 182 and 190 can be appropriately discharged onto wirings 170 and 188, and conduction in circuit 210 is ensured.

Figure 12:
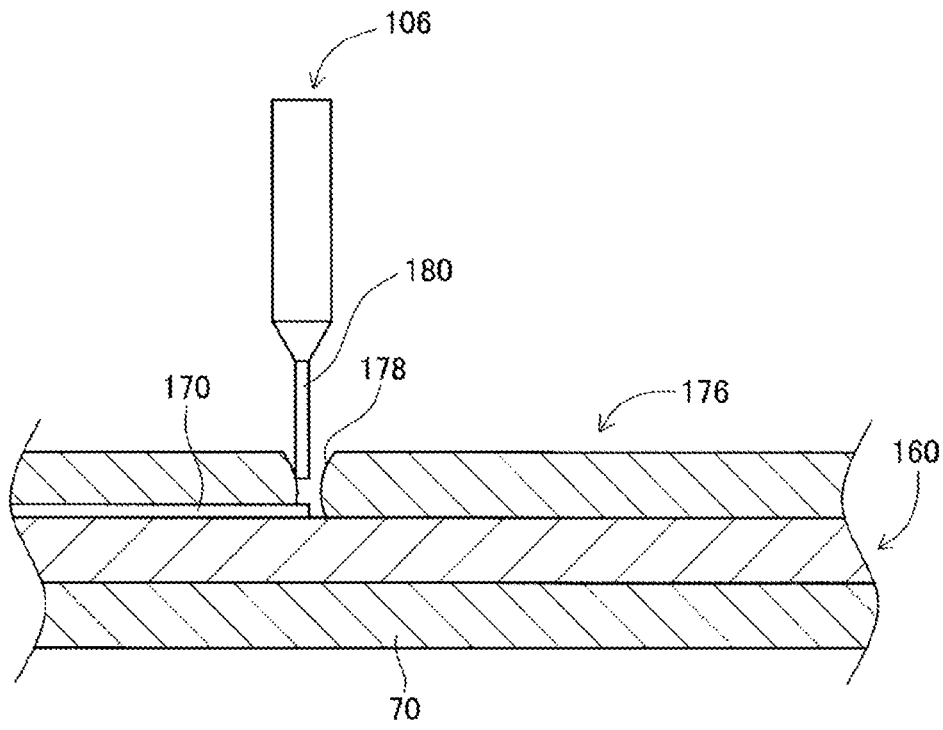
FIG. 12 is a cross-sectional view illustrating a circuit when the conductive resin paste is discharged into the hole of the resin stack.

However, when conductive resin paste 182 is discharged onto wiring 170, the distal end of nozzle 180 of dispenser 106 abuts the inner wall surface defining hole 178 of resin stack 176 as illustrated in FIG. 12, and nozzle 180 may be damaged. In addition, although nozzle 180 does not abut the inner wall surface defining hole 178, nozzle 180 does not appropriately enter the inside of hole 178, and there is a case in which conductive resin paste 182 cannot be discharged into hole 178. In such a case, discharge failure of conductive resin paste 182 may occur, and conduction failure in the circuit may occur. Such abutment of nozzle 180 with the inner wall surface defining hole 178 and discharge failure in which conductive resin paste 182 cannot be discharged into hole 178 occur due to a relative positional deviation between the formation position of wiring 170 and the formation position of hole 178 of resin stack 176.

More specifically, the ultraviolet curable resin, which is the material of resin stack 176, is heated to about 80° C. in inkjet head 88. Meanwhile, the metal ink, which is the material of wiring 170, is heated to about 30° C. in inkjet head 76. As described above, since inkjet head 76 and inkjet head 88 are different in heating temperature, the expansion coefficient due to heating is also different, and deviation occurs in the nozzle pitch between inkjet head 76 and inkjet head 88. Therefore, a relative positional deviation occurs between the formation position of wiring 170 and the formation position of hole 178 of resin stack 176. In addition, depending on the mechanical attachment accuracy of the inkjet head, the individual variation of the inkjet head itself, or the like, a relative positional deviation occurs between the formation position of wiring 170 and the formation position of hole 178. Then, in a case where there is a relative positional deviation between the formation position of wiring 170 and the formation position of hole 178, when dispenser 106 discharges the conductive resin paste by referring to metal mark 172, problems such as abutment of nozzle 180 and discharge failure of the conductive resin paste occur.

Figure 13:
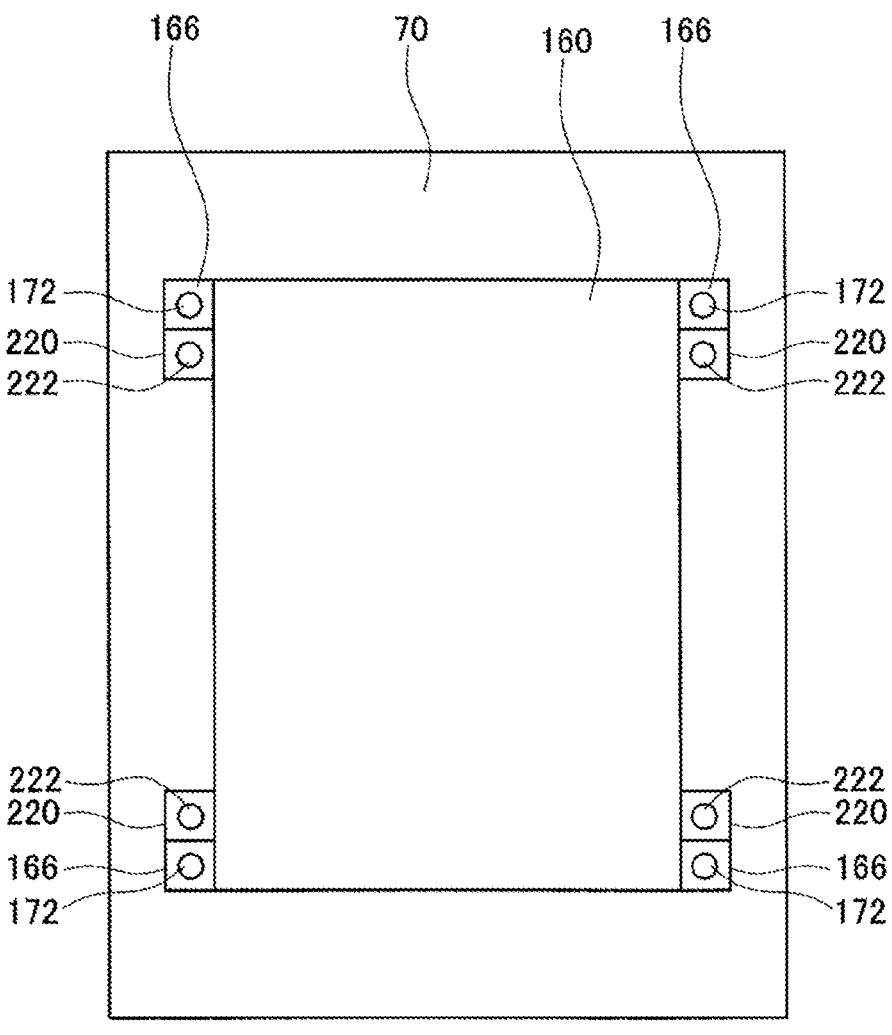
FIG. 13 is a view illustrating a metal mark and a resin mark of a first embodiments.

In view of such a situation, when the conductive resin paste is discharged onto wiring 170 via hole 178 of resin stack 176, dispenser 106 discharges the conductive resin paste by referring to the mark formed of the ultraviolet curable resin that is the material of resin stack 176. More specifically, in second shaping unit 23, when resin stack 160 and four first bases 166 are formed, as illustrated in FIG. 13, four second bases 220 are also formed adjacent to four first bases 166. Second base 220 is formed in the same manner as first base 166. That is, after the ultraviolet curable resin is discharged in a thin film shape and the surface of the ultraviolet curable resin is flattened by flattening device 90, the ultraviolet curable resin is cured by the irradiation of the ultraviolet curable resin with the ultraviolet light. As a result, a resin layer is formed. Then, the discharge of the ultraviolet curable resin, the flattening of the surface of the ultraviolet curable resin, and the curing of the ultraviolet curable resin are repeated and the resin layers are stacked, and thus second base 220 is formed.

As described above, when four second bases 220 are formed as described above, resin mark 222 is formed on each second base 220 by using the ultraviolet curable resin. Resin mark 222 is formed by a method different from that of second base 220. More specifically, after the ultraviolet curable resin is discharged in a thin film shape and the surface of the ultraviolet curable resin is not flattened by flattening device 90, the ultraviolet curable resin is cured by the irradiation of the ultraviolet curable resin with the ultraviolet light. As a result, a resin layer is formed. Then, the discharge of the ultraviolet curable resin and the curing of the ultraviolet curable resin are repeated and the resin layers are stacked, and thus resin mark 222 is formed. Resin mark 222 is generally formed in a circular shape.

Then, when resin mark 222 is formed on second base 220, stage 52 is moved below imaging unit 27. Then, in imaging unit 27, camera 130 images four resin marks 222 formed on four second bases 220. Then, the imaging data obtained through the imaging is analyzed in controller 150, and the positions of four resin marks 222 are calculated based on the imaging data. As a result, the formation position of hole 178 of resin stack 176 formed by inkjet head 88 in similar manner as resin mark 222 can be appropriately recognized.

Although resin mark 222 is formed of the same material as that of second base 220, that is, the ultraviolet curable resin, resin mark 222 is formed by a method different from that of second base 220, so that the position of resin mark 222 can be calculated appropriately based on the imaging data of resin mark 222. More specifically, when the resin mark is formed by the same method as the second base, the resin mark is formed of the same material as the second base, so that the reflectance of the surface of the resin mark and the reflectance of the surface of the second base are substantially the same. As described above, when the reflectance of the surface of the resin mark and the reflectance of the surface of the second base are substantially the same, it is difficult to recognize the outer edge of the resin mark formed on the second base based on the imaging data. Meanwhile, when second base 220) is formed, as described above, the surface of the ultraviolet curable resin is flattened by flattening device 90 before the ultraviolet curable resin is irradiated with ultraviolet light. Therefore, although the surface of second base 220 is flat, there is very small unevenness in a microscopic manner. Meanwhile, when resin mark 222 is formed, the surface of the ultraviolet curable resin is not flattened by flattening device 90, and the ultraviolet curable resin is irradiated with ultraviolet light. Therefore, although the surface of resin mark 222 is not flat, there is almost no microscopic unevenness due to the surface tension or the like of the ultraviolet curable resin. Therefore, the reflectance of the surface of resin mark 222 is different from the reflectance of the surface of second base 220, and the outer edge of resin mark 222 formed on second base 220 can be appropriately recognized based on the imaging data. As a result, the position of resin mark 222 can be appropriately calculated based on the imaging data of resin mark 222.

As described above, when the position of resin mark 222 is calculated based on the imaging data, dispenser 106 discharges the conductive paste onto wiring 170) via hole 178 of resin stack 176 based on the calculated position of resin mark 222. That is, when the conductive resin paste is discharged onto wiring 170 via hole 178, the operation of conveyance device 20 is controlled based on the position of resin mark 222 such that dispenser 106 is positioned above hole 178 in third printing section 100 of third shaping unit 24. As a result, nozzle 180 and hole 178 of dispenser 106 are appropriately matched in a vertical direction. Then, stage 52 is raised by the operation of lifting and lowering device 64, so that, as illustrated in FIG. 7, the distal end of nozzle 180 of dispenser 106 appropriately enters the inside of hole 178. At this time, dispenser 106 discharges the conductive resin paste, so that the conductive resin paste is discharged onto wiring 170 exposed inside hole 178. As described above, dispenser 106 refers to resin mark 222 and discharges the conductive resin paste, so that the conductive resin paste can be appropriately discharged onto wiring 170 via hole 178 of resin stack 176. As a result, it is possible to prevent abutment of nozzle 180 with the inner wall surface defining hole 178, the occurrence of discharge failure of the conductive resin paste, or the like.

When the conductive resin paste is discharged onto a wiring without passing via hole 178, that is, as illustrated in FIG. 10, when the conductive resin paste is discharged onto wiring 188, dispenser 106 discharges the conductive resin paste by referring to metal mark 172. As a result, the conductive resin paste can be appropriately discharged onto wiring 188, and the conduction between wiring 188 and electrode 204 of electronic component 200) can be secured.

That is, in circuit-forming apparatus 10, when the conductive resin paste is discharged into hole 178, dispenser 106 discharges the conductive resin paste by referring to resin mark 222, and when the conductive resin paste is discharged onto wiring 188, dispenser 106 discharges the conductive resin paste referring to metal mark 172. As a result, abutment of nozzle 180 with the inner wall surface defining hole 178, the occurrence of discharge failure of the conductive resin paste, or the like can be prevented, and conduction between wiring 188 and electrode 204 of electronic component 200 can be secured.

Figure 14:
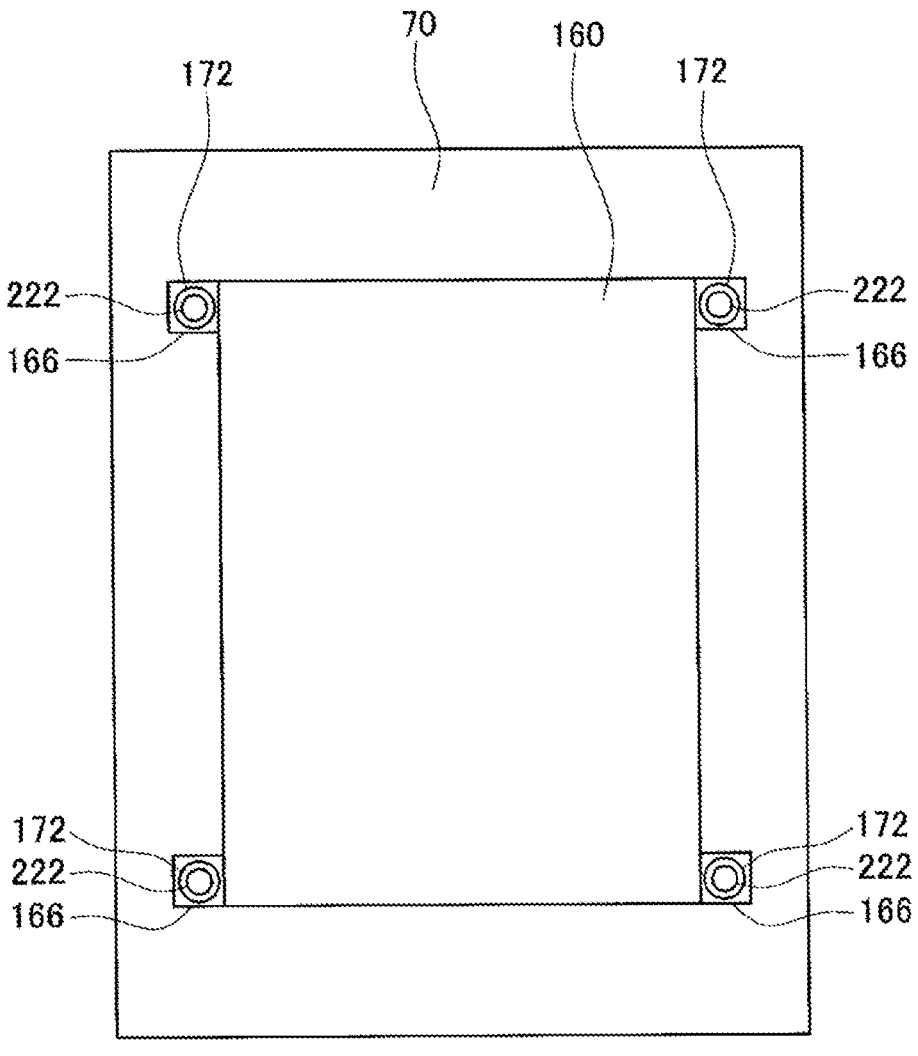
FIG. 14 is a view illustrating a metal mark and a resin mark of a second embodiments.

In the first embodiment, as illustrated in FIG. 13, metal mark 172 is formed on first base 166, and resin mark 222 is formed on second base 220. Alternatively, in the second embodiment, as illustrated in FIG. 14, metal mark 172 is formed on first base 166, and resin mark 222 is formed on metal mark 172. The outer diameter of resin mark 222 is smaller than the outer diameter of metal mark 172. As described above, resin mark 222 is formed on metal mark 172, so that the disposition space for metal mark 172 and resin mark 222 can be reduced. In addition, it is not necessary to create second base 220, and it is possible to shorten the creation time, reduce the cost, or the like.

Figure 15:
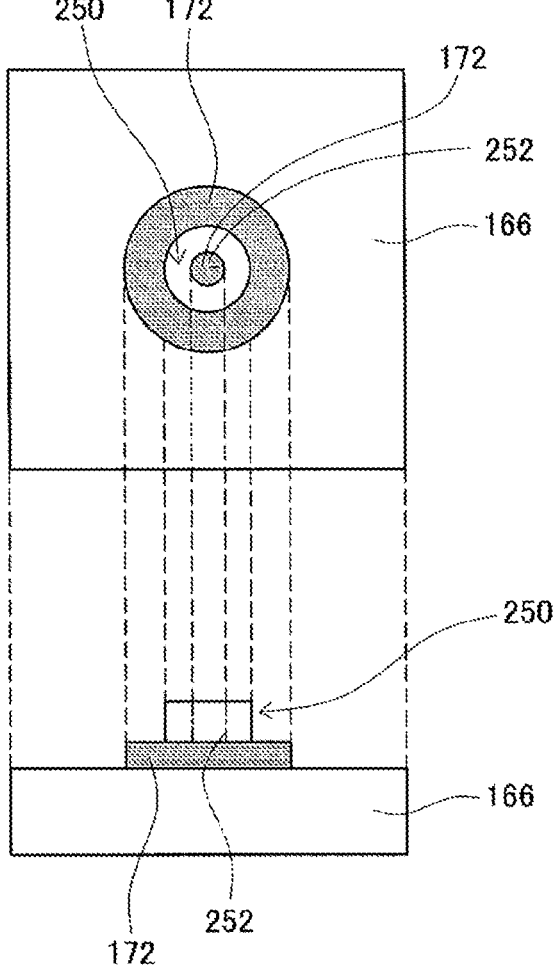
FIG. 15 is a view illustrating a metal mark and a resin mark of a third embodiments.

In addition, in the second embodiment, as illustrated in FIG. 15, metal mark 172 is formed on first base 166, and resin mark 250 having a circular ring shape is formed on metal mark 172. The outer diameter of resin mark 250 is smaller than the outer diameter of metal mark 172. As described above, when resin mark 250 having a circular ring shape is formed on metal mark 172, metal mark 172 is exposed via cavity 252 at the center of resin mark 250 from a viewpoint from above. Then, controller 150 calculates the position of resin mark 250 by recognizing the boundary between the inner wall surface defining cavity 252 at the center of resin mark 250 and the outer edge of metal mark 172 exposed via cavity 252 based on the imaging data. As a result, the position of resin mark 250 can be appropriately calculated.

In addition, as illustrated in FIG. 2, controller 150 of control device 28 includes first forming section 260, second forming section 262, third forming section 264, fourth forming section 266, and discharge section 268. First forming section 260 is a functional section for forming resin stacks 160 and 176, first base 166, second base 220, and resin mark 222. Second forming section 262 is a functional section for forming connection electrode 184 inside hole 178 by referring to resin mark 222. Third forming section 264 is a functional section for forming wiring 188. Fourth forming section 266 is a functional section for forming resin mark 222 on metal mark 172. Discharge section 268 is a functional section for discharging the conductive resin paste onto wiring 188 by referring to metal mark 172.

In the above embodiments, circuit-forming apparatus 10 is an example of a circuit-forming apparatus. Inkjet head 76 is an example of a third discharge device. Inkjet head 88 is an example of a first discharge device. Flattening device 90 is an example of a flattening device. Dispenser 106 is an example of a second discharge device. Metal mark 172 is an example of a second mark. Resin stack 176 is an example of a resin layer. Hole 178 is an example of a recessed portion. Connection electrode 184 is an example of an electrode. Wiring 188 is an example of a wiring. Second base 220 is an example of a base. Resin mark 222 is an example of a first mark. Resin mark 250 is an example of a first mark. In addition, a step performed by first forming section 260 is an example of a first forming step. A step performed by second forming section 262 is an example of a second forming step. A step performed by third forming section 264 is an example of a third forming step. A step by fourth forming section 266 is an example of a fourth forming step. A step performed by discharge section 268 is an example of a discharging step.

The present disclosure is not limited to the embodiments described above, and can be performed in various aspects to which various modifications and improvements are applied based on the knowledge of those skilled in the art. For example, in the second embodiment, resin mark 222 is formed on metal mark 172, but metal mark 172 may be formed on resin mark 222. In addition, in the second embodiment, annular-shaped resin mark 250 is formed on metal mark 172, but the annular-shaped metal mark may be formed on resin mark 222.

In addition, in the above embodiments, when second base 220 is formed, the surface of the ultraviolet curable resin is flattened before the ultraviolet curable resin is irradiated with ultraviolet light, and when resin mark 222 is formed, the ultraviolet curable resin is irradiated with ultraviolet light without flattening the surface of the ultraviolet curable resin. Meanwhile, when resin mark 222 is formed, the surface of the ultraviolet curable resin may be flattened before the ultraviolet curable resin is irradiated with ultraviolet light, and when second base 220 is formed, the ultraviolet curable resin may be irradiated with ultraviolet light without flattening the surface of the ultraviolet curable resin.

In addition, in the above embodiments, connection electrode 184 is formed inside hole 178 of resin stack 176, that is, inside the through hole penetrating resin stack 176, but the connection electrode may be formed inside the bottomed hole of resin stack 176.

In addition, although resin stacks 160 and 176 are formed of the ultraviolet curable resin in the above embodiments, the resin stack may be formed of various curable resins such as a thermosetting resin, a thermoplastic resin, and a two-component mixed curable resin.

REFERENCE SIGNS LIST

10: circuit-forming apparatus (shaping device), 76: inkjet head (third discharge device), 88: inkjet head (first discharge device), 90: flattening device, 106: dispenser (second discharge device), 172: metal mark (second mark), 176: resin stack (resin layer), 178: hole (recessed portion), 184: connection electrode (electrode), 220: second base (base), 222: resin mark (first mark), 250: resin mark (first mark), 260: first forming section (first forming step), 262: second forming section (second forming step), 264: third forming section (third forming step), 266: fourth forming section (fourth forming step), 268: discharge section (discharging step).

The invention claimed is:

1. A circuit-forming method comprising:
a first forming step of forming a resin layer on a pallet by a first discharge device configured to discharge a curable resin, the resin layer including a recessed portion;
a step of forming a base on the pallet by discharging the curable resin by the first discharge device, flattening a surface of the curable resin by a flattening device, and then curing the curable resin, the base formed on the pallet adjacent to a corner of the resin layer;
a step of forming a first mark by discharging the curable resin on the base by the first discharge device and curing the curable resin without flattening the surface of the curable resin by the flattening device; and
a second forming step of forming an electrode inside the recessed portion by a second discharge device, which is configured to discharge a conductive paste, by referring to the first mark formed by the first discharge device.

2. The circuit-forming method according to claim 1, further comprising:
a third forming step of forming a wiring by a third discharge device configured to discharge a conductive ink; and
a discharging step of discharging the conductive paste onto the wiring by the second discharge device by referring to a second mark formed by the third discharge device.

3. The circuit-forming method according to claim 2, further comprising:
a fourth forming step of forming a first one of the first mark and the second mark in a state of overlapping a second one of the first mark and the second mark.

4. The circuit-forming method according to claim 3, wherein
in the fourth forming step, one of the first mark and the second mark is formed in an annular shape.

5. The circuit-forming method according to claim 1, wherein a reflectance of the surface of the first mark is different from a reflectance of the surface of a second base.

* * * * *